United States Patent [19]
Maro et al.

[11] Patent Number: 5,127,340
[45] Date of Patent: Jul. 7, 1992

[54] ADJUSTABLE SHELVING SYSTEM

[75] Inventors: Nicholas Maro, Chicago Heights; Kenneth Kutschke, Berwyn; Anthony Kozon, Burbank, all of Ill.

[73] Assignee: Viking Metal Cabinet Company Inc., Chicago, Ill.

[21] Appl. No.: 552,167

[22] Filed: Jul. 13, 1990

[51] Int. Cl.[5] .................................................. A47B 9/00
[52] U.S. Cl. ................................ 108/107; 211/187; 248/241
[58] Field of Search .............. 108/107, 106, 110, 111, 108/144; 211/207, 208, 187, 153, 190; 248/250, 242, 239, 241

[56] References Cited

U.S. PATENT DOCUMENTS

| D. 294,221 | 2/1988 | Sheftel | 248/242 X |
|---|---|---|---|
| 4,152,034 | 5/1979 | Dunning, III | 248/239 X |
| 4,669,692 | 6/1987 | Mastrodicasa | 211/187 X |
| 4,730,735 | 3/1988 | Lechnel | 211/126 X |
| 4,938,442 | 7/1990 | Mastrodicasa | 248/250 |

FOREIGN PATENT DOCUMENTS

| 221197 | 6/1958 | Australia | 108/107 |
|---|---|---|---|
| 627994 | 11/1961 | Italy | 211/187 |
| 211026 | 2/1924 | United Kingdom | 108/107 |

Primary Examiner—Jose V. Chen

[57] ABSTRACT

An adjustable shelving system having a pair of spaced uprights, each having a pair of spaced columns defining a plurality of mounting apertures which are adapted to receive fasteners securing brackets to the uprights, the brackets, in turn, supporting one or more shelves, each of which is provided with storing grooves for receiving storing units in their upright positions. Each bracket is provided with a pair of spaced slots angularly disposed with respect to a horizontal, one of the slots having an upper wall provided with indentations serving as a ratchet in conjunction with a fastener. The number of indentations that is selected determines incremental vertical movements of adjustability for the shelf. The lower edge of the bracket is provided with an upwardly facing flange which is adapted to receive a downward facing flange of the shelf. The interengagement of the metallic flanges, the metallic construction of the shelf and the upright providing dissipation of accumulated static electricity that could affect the stored units such as circuit boards. The upwardly facing flange is provided with one or more notches to facilitate the grasping of the bracket while positioning the bracket for adjusting the shelf.

11 Claims, 2 Drawing Sheets

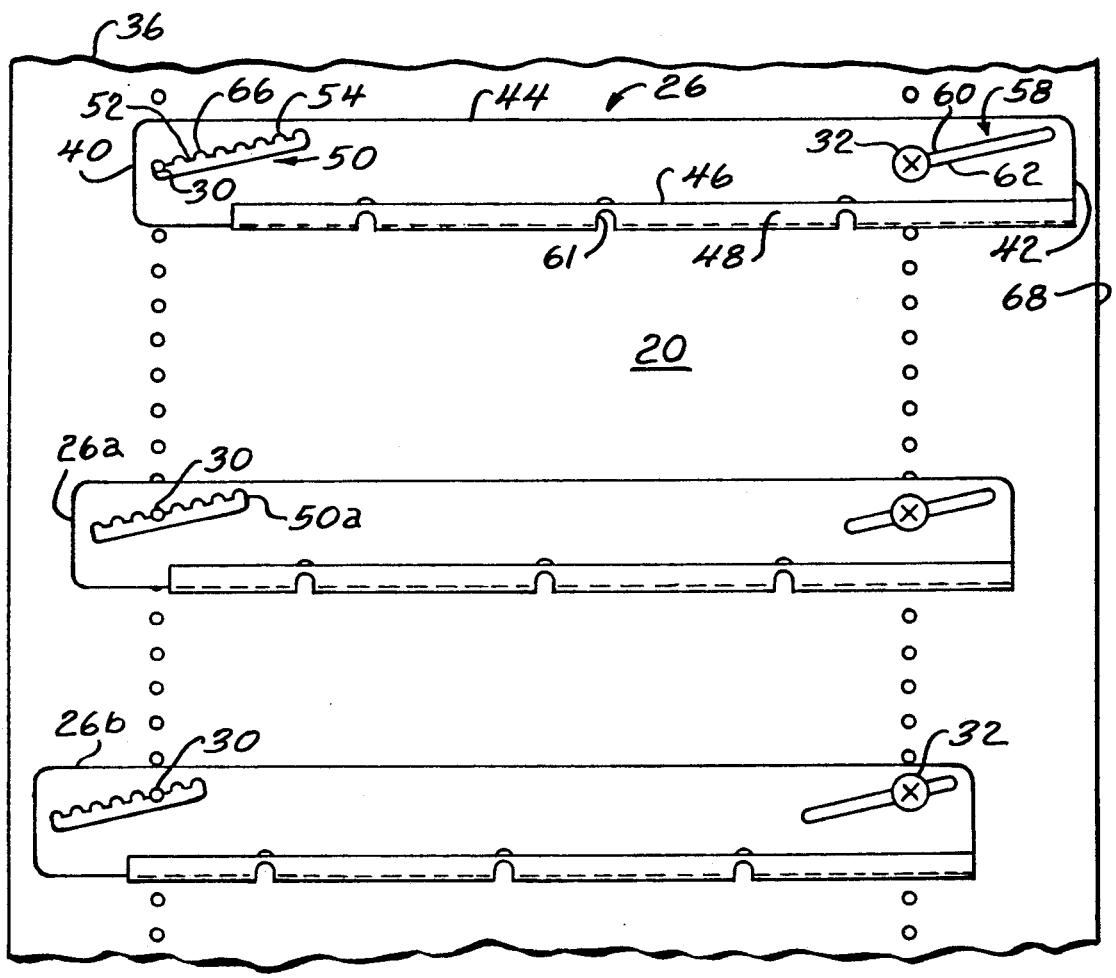
FIG. 3
FIG. 4
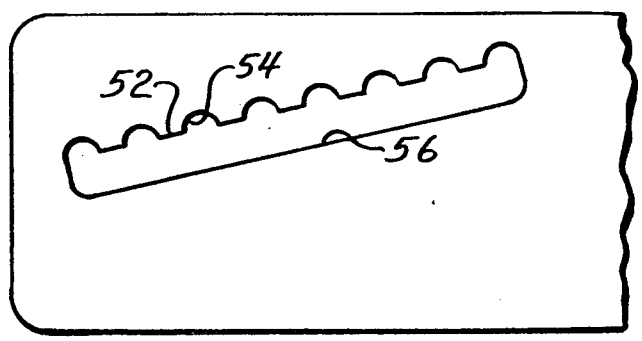

1

ADJUSTABLE SHELVING SYSTEM

BACKGROUND OF THE INVENTION

1. Field of the Invention

This invention relates generally to shelves adjustably positionably in support structures, and more particularly to a system wherein the support structures and the shelves cooperatively define vertical adjustment of the shelves in precise and incremental spacial disposition.

2. Description of the Prior Art

One particular type of a shelving system has a pair of spaced upright standards, each standard having a plurality of slots spaced at one-half inch intervals vertically in a column, each upright standard having a pair of spaced columns, and each column being associated with an individual bracket adapted to support a shelf which, in its mounted position, rests on four brackets. The closest space for adjustment of adjoining shelves is one-half inch, which is not useful in storing items, especially in situations where both sides of the shelves are provided with holding surfaces such as grooves or undulations for storing items in their vertical positions. Another type of adjustable shelving system uses a pair of spaced upright standards having a series of spaced tabs aligned in columns to support the shelves. There is no provision for obtaining adjustment of shelves between two adjoining tab positions.

SUMMARY OF THE INVENTION

The invention relates to an adjustable shelving system which can be used for rapid, accurate and easy positioning and re-positioning between upright standards and shelves for items that require precise space positioning for safe and stable storage. This type of adjustable shelving system is very suitable in storing various makes and variable sizes of printed circuit boards, glass panels, specialties, spacing dividers, and similarly configurated items. The present invention is concerned with precise adjustment of shelves which are provided with top and bottom holding surfaces which are adapted to hold items in their vertical positions. This allows for safe and secure storage, ease in indexing for retrieval, and ease in inventory control either manually or with a scanning device. The bracket concept design also promotes dissipation of accumulated destructive static electricity through the use of a metal edge which engages the bottom surface of the shelf to discharge any accumulated static electricity to ground via the metallic structure of the upright standards.

The main object of the invention is to provide adjustability between upright standards and brackets supporting the shelves.

A further object of the invention is to provide an adjustable shelf support structure containing means for incrementally adjusting the vertical position of the shelves with respect to each other.

Another object of the invention is to provide a shelf bracket provided with a pair of angular slots, one of the slots being provided with incrementally positioned adjoining gripping surfaces.

Another object of the invention is to provide adjustable brackets having a flange providing support for the shelf.

A further object of the invention is to provide the upright standards with a number of vertically spaced holes arranged in columns and functioning to cooperate with brackets having angular slots, wherein one of the angular slots is provided with incrementally angularly spaced predetermined gripping surfaces.

An adjustable shelving system has a pair of spaced upright standards provided with a number of spaced holes aligned in columns, each upright standard being provided with a pair of spaced columns, the holes adapted to be engaged by holding members such as screws which pass through angled slots in a bracket positioned or abutting the upright standard, one of the angled slots being provided with a gripping surface which can be adjustably positioned with respect to the holding screws. Depending on the vertical positioning of the holding screws on one side of the upright standard, a shelf can be positioned either in a horizontal position, or in a declining or inclining position with respect to the horizontal. The shelf can also be adjusted so that one end of the shelf held by the brackets to one upright standard can be made lower or higher with respect to the bracket attached to the other upright standard.

To overcome the foregoing discussed disadvantages of prior art adjustable shelf support structures, the present invention has a pair of upright supports spaced from each other by a distance to accommodate supporting therebetween a shelf which is adjustably supported with respect to the spaced upright supports by an intervening pair of brackets, each bracket provided with a pair of slots angularly disposed with respect to a horizontal plane, one slot being located near the front end of the bracket, and the other slot being located near the rear end of the bracket. The slot which is located near the front end of the bracket is defined longitudinally by a pair of spaced upper and lower walls, the upper wall being provided with a predetermined number of indentations. The slot located at the rear end of the bracket is also defined by a pair of spaced upper and lower walls. However, no indentations are provided. The brackets are fastened to the upright supports by fasteners which cooperate with a plurality of mounting apertures spaced from each other by a predetermined distance and arranged in vertical columns. Each bracket has an upper linear edge and a lower edge defining an upwardly facing flange which extends from the rear end of the bracket up to about the mid-position of the front slot, the flange having one or more notches to facilitate the grasping of the bracket during effecting adjustment and positioning of the bracket with respect to the upright support. The shelf comprises a pair of spaced upper and lower panels, each panel having an exterior face provided with a plurality of grooves which have a predetermined width to accommodate receipt of a stored unit such as a circuit board.

These and other objects and advantages of the invention will more fully appear from the following description, made in connection with the accompanying drawings.

BRIEF DESCRIPTION OF THE DRAWINGS

FIG. 3 is an enlarged interior view of the shelf support structure looking at the left upright support in FIG. 1; and FIG. 4 is an enlarged view of a front end of a bracket provided with an angular slot having a number of predetermined spaced indentations.

BRIEF DESCRIPTION OF THE PREFERRED EMBODIMENT

Figure 1:
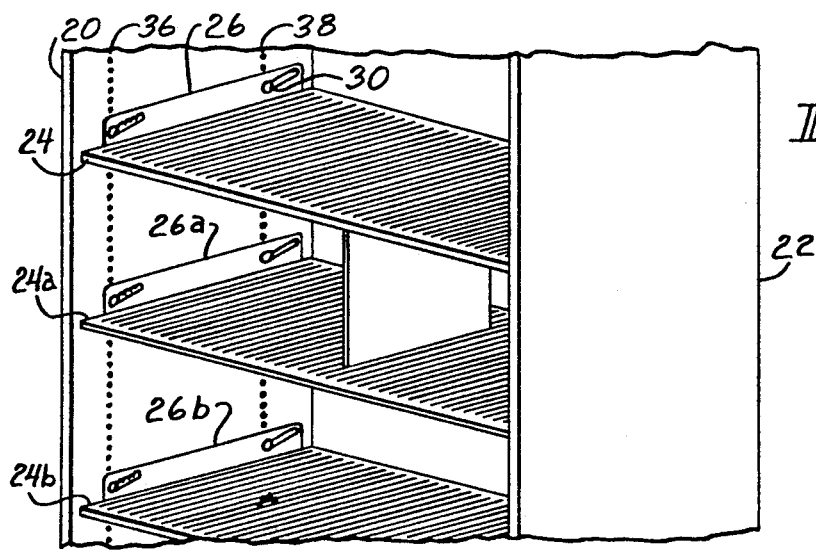
FIG. 1 is a partial perspective view of an adjustable shelf support structure.

Referring to FIG. 1, there is shown a pair of upright supports 20 and 22 which are spaced from each other by a predetermined distance for the receipt of a shelf 24 which is supported by a pair of brackets (FIG. 2) 26 and 28 which are secured by fasteners 30 and 32 to the respective upright supports 20 and 22. The fasteners 30 and 32 are adapted to engage with a plurality of apertures 34 arranged in columns 36 and 38.

In the embodiment shown in FIG. 1, additional shelves 24a an 24b are shown. However, it is clear that any number of shelves can be arranged depending on the size of units stored on the shelves. Of course, the spacing between adjoining shelves 24, 24a, 24b can also be altered depending on storage requirements. The bracket 26, as illustrated in FIG. 3, has a front end 40 and a rear end 42, an upper edge 44, and a lower edge 46 which has been deformed to define a flange 48 which extends from the rear end 42 over a substantial length of the bracket 26 up to about the mid-point of an angular slot 50 which has an upper wall 52 (FIG. 4) provided with a gripping surface or indentations 54 and a smooth lower wall 56. Similarly, the rear end of the bracket 26 is provided with an angular slot 58 defined by upper and lower walls 60 and 62, respectively. However, neither of these walls 60, 62 is provided with any indentations. The flange 48 is provided with a number of notches 64 so that the bracket may be grasped to effect adjustment.

As shown in FIG. 3, a first indentation 66 is covered by a head of the fastener 30 and locates the bracket 26 in its innermost position with respect to a rear edge 68 of the upright support 20. The rear of the bracket 26 is supported by the fastener 32 occupying the forward end of the slot 58. The front end of bracket 26 is supported by the fastener 30 in the mid-range of the slot 50a. The brackets 26a and 26b are shown engaged by fasteners 30 and 32 in progressively forward positions with respect to the upright support 20.

Figure 2:
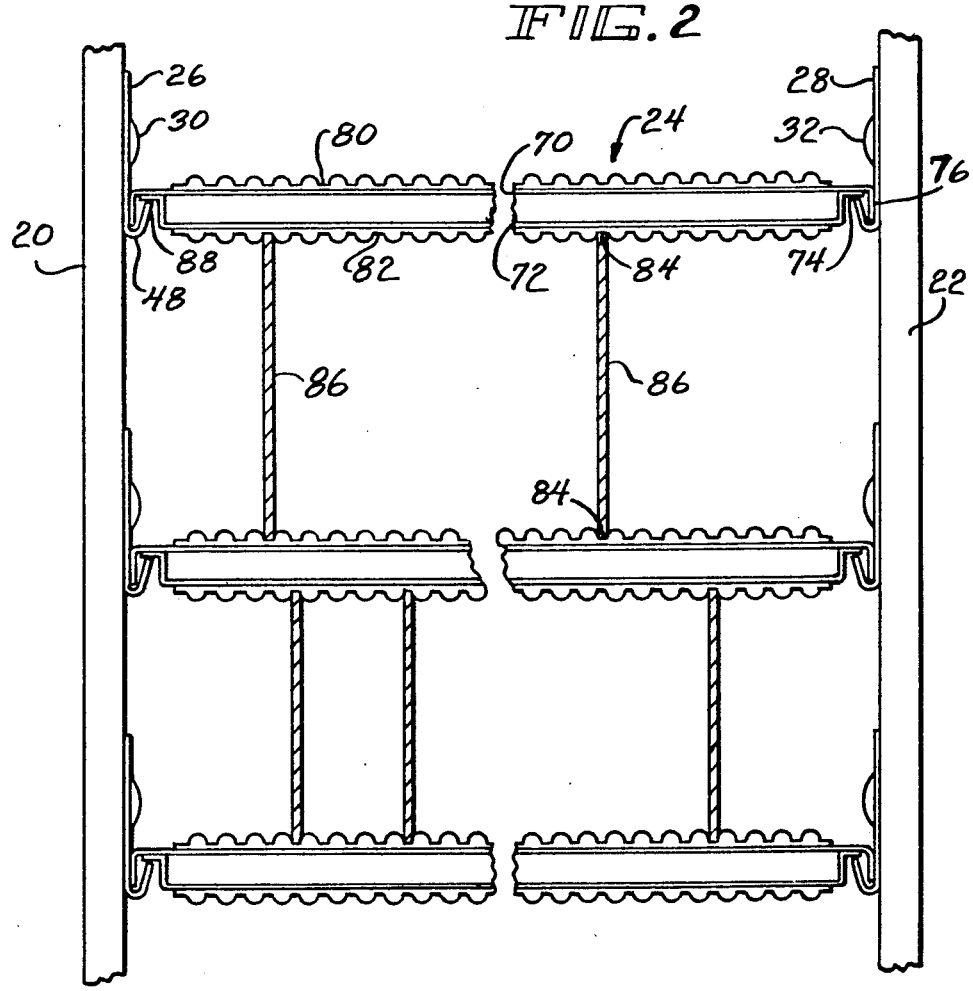
FIG. 2 is an enlarged fore-shortened view of the shelf support structure.

Referring to FIG. 2, the shelf 24 comprises an upper panel 70 spaced from a lower panel 72 which has flanges 74 secured to an underside of the upper panel 70. The upper panel 70 terminates in downwardly extending flanges 76 which are adapted to be received by flanges 48 on the brackets 26 and 28. The surface of the upper panel 70 is provided with a number of grooves 80 and the lower panel 72 is similarly provided with a number of grooves 82. The width of each groove is sufficient to loosely receive side edges 84 of a stored unit 86.

Each column of apertures 34 is identical to the other column of apertures as to a starting point, space between holes, and as to size and configuration of the apertures. The positioning of the columns 36, 38 of the apertures 34 on upright supports 20, 22 corresponds to a fastening and full use of adjustment of shelf mounting brackets. The apertures 34 cooperate with the fasteners 30, 32 used to mount each adjustable bracket. The adjustment brackets 26, 26a, and 26b each have two angularly directed slots 50, 58, one slot 50 being near the front end 40 of the upright support 20 and the rear slot 58 being near the rear end 42 of the upright support 20. The front slot 50 is provided with a number of indentations 54 in the upper wall to serve as a ratchet. The angularity of each slot is identical. The angle of the slots and the amount of ratchet indentations is a predetermined entity. This permits a user to adjust a predetermined precise horizontal position for the shelf. Of course, it is also possible to achieve a predetermined precise inclination or declination extending from the front to the back of the shelf.

For example, a 0.062 (1/16) inch declination or inclination per ratchet indentation position is used. The angular slot has eight ratchet positions, with each position at 0.062 (1/16) inch higher from the front to the back with a total of 0.50 inch for positioning. Since the mounting aperture spacing in the upright support is 0.50 inch apart, this allows for a predetermined adjustment of shelves within a range of all mounting apertures in the upright supports.

Notably, with this inventive principle, the ratio of change can be varied from what is illustrated. For instance, 10 ratchet indentations within the 0.50 inch range will change inclination or declination per notch 0.050 inch. Using mounting apertures positioned at 0.25 inch apart on the upright support and a bracket having a 10-indentation range rise of 0.25 inch total, the declination or inclination per notch would be 0.025 inch. Thereby, the adjustment range would be 0.025 inch throughout the range of the upright supports.

The operation of the present invention has been notably based on the shelves being adjusted in parallel, up or down, when the right and the left side brackets are using the same ratchet position. The front edge and the rear edge of the bracket are kept parallel automatically by the equal angular incline or decline of the slots on the bracket, provided the fastener apertures used in the upright supports are equally distant from the starting point or bottom. However, the invention can also set up shelves to an angular predetermined position if required in increments used in the bracket ratchet, that is, setting the ratchet position on the right side different from the ratchet position on the left side of the shelf.

Besides the adjustment feature of the present invention, the brackets are provided with flanges having upward acute angles for supporting shelves that are placed on the brackets. An upward edge 88 of the flange 48 contacting the shelf 24 promotes dissipation of static electricity which can be destructive to the electronic components stored on the printed circuit boards.

It will be understood that various changes may be made in the form, details, arrangements and proportions of the parts without departing from the scope of the invention.

What is claimed is:

1. An adjustable support structure comprising:
    opposing, upright support members having a plurality of uniformly spaced mounting apertures, said apertures forming a pair of equidistant vertical columns on each support member;
    at least one pair of brackets each having linear flange means and a pair of parallel slots spaced along a length of each bracket, said slots being inclined relative to said linear flange, one of said slots having a wall provided with a gripping surface; and
    fastening means extending through said slots for adjustably interconnecting each of said brackets to a selected pair of said mounting apertures on said support members whereby said gripping surface adjusts the vertical position of said bracket and said flange may support a horizontal member interposed between said opposing support members.

2. An adjustable support structure according to claim 1, wherein said flange extends in an upward direction from a lower portion of said bracket and each end of the horizontal member is provided with a downwardly extending flange adapted to engage said upwardly extending flange of said bracket.

3. An adjustable support structure according to claim 2, said upwardly facing flange being provided with a gripping means.

4. An adjustable support structure according to claim 3, wherein said gripping means comprises one or more notches transversely passing through said flange.

5. An adjustable support structure according to claim 1, wherein said wall provided with said gripping surface is an upper wall of said slot provided with a number of indentations defining ratchet positions spaced equidistant from one another and adapted to engage with said adjustable fastening means whereby the vertical position of said bracket may be adjusted by engaging said fastening means with one of said indentations defining one of said ratchet positions.

6. An adjustable support structure according to claim 5, wherein said adjustable fastening means are adapted to be secured in said apertures.

7. An adjustable support structure according to claim 5, wherein the apertures forming said vertical columns are vertically spaced from each other by a predetermined distance, said gripping surface of said slot having a predetermined number of indentations defining increments of vertical adjustability of the bracket with respect to said upright support members.

8. An adjustable support structure according to claim 7, wherein the apertures are 0.50 inch apart, and the inclined slot has eight ratchet positions, each ratchet position providing a 0.062 inch vertical positioning of the bracket between adjoining apertures.

9. An adjustable support structure according to claim 1, wherein said horizontal member is at least one shelf having a plurality of spaced grooves along the upper and lower surfaces adapted for receiving edges of stored units.

10. A shelf support bracket for engagement with an upright support comprising linear flange means along the length of the bracket and extending outwardly from said bracket for engaging an end of a shelf, and a pair of parallel slots spaced apart along the length of the bracket, said slots being inclined with respect to said flange means, at least one of said slots having a plurality of equally spaced indentations in an upper edge wherein each slot is adapted to engage a fastening member attached to said support.

11. A shelf support bracket as claimed in claim 10, wherein said fastening member extends through one of said indentations in said upper edge of said inclined slot and whereby said bracket may be incrementally adjusted in the vertical direction in proportion to the space between the indentations in said slot.

* * * * *